US009106207B2

(12) United States Patent
Kiss et al.

(10) Patent No.: US 9,106,207 B2
(45) Date of Patent: Aug. 11, 2015

(54) SWITCHING POWER AMPLIFIER SYSTEM FOR MULTI-PATH SIGNAL INTERLEAVING

(71) Applicant: LSI Corporation, Milpitas, CA (US)

(72) Inventors: Peter Kiss, Basking Ridge, NJ (US);
Said E. Abdelli, Minneapolis, MN (US);
Kameran Azadet, Pasadena, CA (US);
Donald R. Laturell, Oak Hill, FL (US);
James F. MacDonald, Stillwater, MN (US); Ross S. Wilson, Menlo Park, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 416 days.

(21) Appl. No.: 13/709,743

(22) Filed: Dec. 10, 2012

(65) Prior Publication Data
US 2014/0159991 A1      Jun. 12, 2014

(51) Int. Cl.
| H03F 3/68 | (2006.01) |
| H03H 11/00 | (2006.01) |
| H03F 3/217 | (2006.01) |
| H03F 3/24 | (2006.01) |
| H03M 3/00 | (2006.01) |

(52) U.S. Cl.
CPC ............ *H03H 11/00* (2013.01); *H03F 3/2175* (2013.01); *H03F 3/24* (2013.01); *H03M 3/50* (2013.01)

(58) Field of Classification Search
CPC .......... H03F 3/2175; H03F 3/24; H03M 3/50; H03H 11/00
See application file for complete search history.

(56) References Cited

U.S. PATENT DOCUMENTS

| 7,053,700 | B2 | 5/2006 | Smiley et al. | |
| 7,443,324 | B1 * | 10/2008 | Muhammad | 341/131 |
| 8,269,555 | B2 | 9/2012 | van Der Heijden et al. | |
| 2006/0033752 | A1 * | 2/2006 | Gering et al. | 345/629 |
| 2008/0297247 | A1 * | 12/2008 | Rabjohn et al. | 330/149 |
| 2012/0022752 | A1 * | 1/2012 | Arnold et al. | 701/54 |
| 2014/0028391 | A1 * | 1/2014 | Morris et al. | 330/147 |
| 2014/0269978 | A1 * | 9/2014 | Kiss et al. | 375/295 |

FOREIGN PATENT DOCUMENTS

| EP | 1393438 B1 | 6/2009 |
| EP | 2506426 A1 | 3/2012 |

* cited by examiner

*Primary Examiner* — Trinh Dinh
(74) *Attorney, Agent, or Firm* — Suiter Swantz pc llo

(57) ABSTRACT

A switching power amplifier for multi-path signal interleaving includes a signal splitter configured to split a multi-bit source signal from a digital source into a plurality of multi-bit signals, one or more fractional delay filters configured to delay one or more signals of the plurality of signals by a selected time, a plurality of bit-stream converters, each bit-stream converter configured to receive one of the multi-bit signals, each bit-stream converter further configured to generate a single-bit signal based on a received multi-bit signal, a plurality of switching power amplifiers, each switching power amplifier configured to receive a single-bit signal from one of the bit-stream converters, and an interleaver configured to generate an interleaved output by interleaving two or more outputs of the switching power amplifiers, wherein a sampling frequency of the interleaved output of the interleaver is greater than the selected sampling frequency of the multi-bit source signal.

20 Claims, 11 Drawing Sheets

000# SWITCHING POWER AMPLIFIER SYSTEM FOR MULTI-PATH SIGNAL INTERLEAVING

BACKGROUND

In the design and construction of systems for radio frequency (RF) generation, it is desirable to develop systems with increased switching speeds and reduced power consumption. Switching power amplifiers are commonly implemented in conjunction with bit-stream generators in the field of RF signal generation. Switching speeds of switching power amplifiers are limited by characteristics of the power transistors and the source-impedance of the driver included in the given switching power amplifier. These characteristics of the power transistor include gate-source capacitance, gate-drain capacitance, drain-source capacitance, common-source or common-gate or common-drain configuration and the like. It is therefore desirable to produce a method and system that mitigates the shortfalls of the prior art, thereby providing a switching power amplifier architecture with increased switched speeds and reduced power consumption.

SUMMARY

A switching power amplifier system for multi-path signal interleaving is disclosed. In one embodiment, the switching power amplifier system for multi-path signal interleaving includes, but is not limited to, a signal splitter configured to receive a multi-bit source signal from a digital signal source, wherein the signal splitter is configured to split the multi-bit source signal, having a selected sampling frequency, from the digital source into a plurality of multi-bit signals. In another embodiment, the switching power amplifier system includes one or more fractional delay filters configured to delay one or more signals of the plurality of signals from the signal splitter by a selected time. In an additional embodiment, the switching power amplifier includes a plurality of bit-stream converters, wherein each bit-stream converter is configured to receive one of the plurality of multi-bit signals, each bit-stream converter further configured to generate a single-bit signal based on a received multi-bit signal. In another embodiment, the switching power amplifier system includes a plurality of switching power amplifiers, wherein each switching power amplifier is configured to receive a single-bit signal from one of the bit-stream converters, wherein each of the switching power amplifiers is further configured to convert the received single-bit signal from one of the bit-stream converters to an analog signal. In another embodiment, the switching power amplifier system includes an interleaver configured to generate an interleaved output by interleaving two or more outputs of the plurality of switching power amplifiers, wherein a sampling frequency of the interleaved output of the interleaver is greater than the selected sampling frequency of the multi-bit source signal.

In another embodiment, the switching power amplifier system for multi-path signal interleaving includes, but is not limited to, a signal splitter configured to receive a multi-bit source signal having a selected sampling frequency from a digital signal source, wherein the signal splitter is configured to split the multi-bit source signal from the digital source into a plurality of multi-bit signals. In another embodiment, the switching power amplifier system includes one or more fractional delay filters configured to delay one or more signals of the plurality of signals by a selected time. In an additional embodiment, the switching power amplifier system includes a plurality of bit-stream converters, each bit-stream converter configured to receive one of the plurality of multi-bit signals, each bit-stream converter further configured to generate a single-bit signal based on a received multi-bit signal. In another embodiment, the switching power amplifier includes an interleaver configured to generate a single-bit interleaved output by interleaving two or more outputs of the plurality of bit-stream converters, wherein a sampling frequency of the interleaved output of the interleaver is greater than the selected sampling frequency of the multi-bit source signal. In an additional embodiment, the switching power amplifier system includes a switching power amplifier configured to receive the single-bit interleaved output signal from the interleaver, wherein the switching power amplifier is configured to convert the single-bit interleaved output signal from the interleaver to an analog signal.

A method for multi-path signal interleaving is disclosed. In one embodiment, the method includes, but is not limited to, splitting a multi-bit source signal from a digital signal source into a plurality of multi-bit signals, wherein the multi-bit source signal has a selected sampling frequency, delaying one or more signals of the plurality of multi-bit signals by a selected time, converting the plurality of multi-bit signals into a plurality of single-bit signals, wherein each multi-bit signal is converted to a single-bit signal, converting the plurality of single-bit signals into a plurality of analog signals, wherein each single-bit signal is converted to an analog signal, and generating an output signal by interleaving the plurality of analog signals, wherein a sampling frequency of the output signal is greater than the selected sample frequency of the multi-bit source signal.

In another embodiment, the method includes, but is not limited to, splitting a multi-bit source signal from a digital signal source into a plurality of multi-bit signals, wherein the multi-bit source signal has a selected sampling frequency, delaying one or more signals of the plurality of multi-bit signals by a selected time, converting the plurality of multi-bit signals into a plurality of single-bit signals, wherein each multi-bit signal is converted to a single-bit signal, generating a single-bit interleaved output signal by interleaving the plurality of analog signals, wherein a sampling frequency of the single-bit interleaved output signal is greater than the selected sample frequency of the multi-bit source signal, and converting the single-bit interleaved output signal into an analog signal.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the embodiments of the invention. Reference will now be made in detail to the subject matter disclosed, which is illustrated in the accompanying drawings.

Referring generally to FIGS. 1A through 6, a switching power amplifier system for multi-path signal interleaving is described in accordance with the present disclosure. Signal interleaving on the digital or analog domain within a multi-path switching power amplifier system provides for increased switching speeds and reduced power consumption in the switching power amplifier system, allowing for switching speeds that extend beyond typical single-path component-limited switching speeds.

Figure 1A:
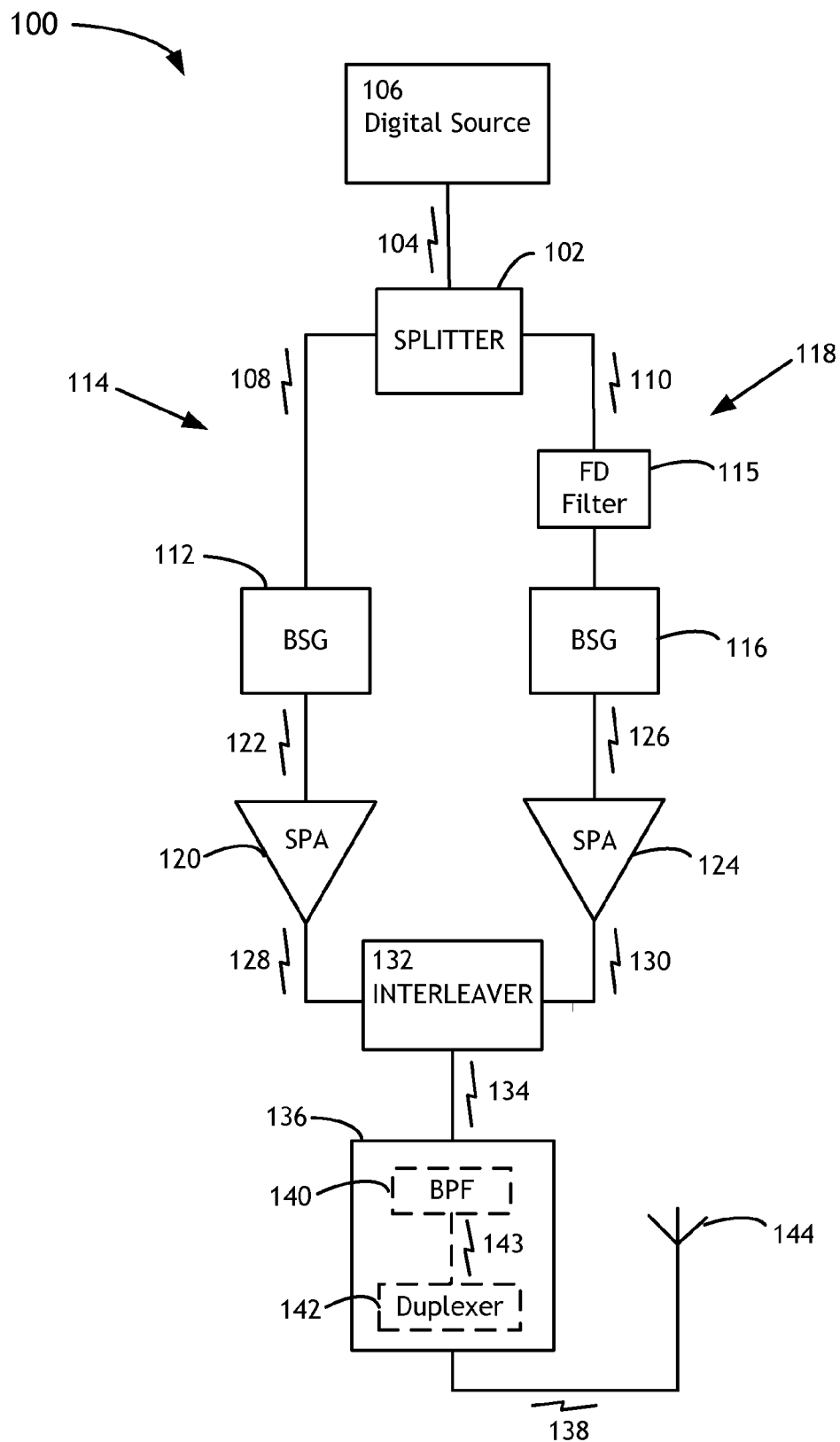
FIG. 1A is a block diagram illustrating the switching power amplifier for two-path signal interleaving in the analog domain, in accordance with one embodiment of the present invention.

Referring now to FIG. 1A, a block diagram of a switching power amplifier system 100 for multi-path signal interleaving is described in accordance with one embodiment of the present invention. The switching power amplifier system 100 includes a signal splitter 102 and two or more bit-stream generators (e.g., a first bit-stream generator 112, a second bit-stream generator 116, and up to and including an Nth bit-stream generator) suitable for receiving the multi-path signals from the signal splitter 102. The switching power amplifier system 100 further includes two or more switching power amplifiers (e.g., a first switching power amplifier 120, a second switching power amplifier 124, and up to and including an Nth switching power amplifier) coupled to the output of the two or more bit-stream generators. The switching power amplifier system 100 further includes an interleaver 132 for interleaving the analog outputs of the two or more switching power amplifiers.

In one embodiment, the signal splitter 102 of the switching power amplifier system 100 is configured to split a digital source signal 104 having a selected sampling frequency ($F_s$) from a digital signal source 106 into a first digital signal 108 transmitted along a first path 114 and a second digital signal 110 transmitted along a second path 118. In one embodiment, the digital signal source is a multi-bit signal source.

In another embodiment, the signal splitter 102 transmits a first signal 108 and a second signal 110 having the same sampling frequency. In yet another embodiment, both the first signal 108 and the second signal 110 have the same sampling frequency as the source signal 104. The signal splitter 102 may include any signal splitter known in the art.

In another embodiment, the system 100 includes a fractional delay filter 115 disposed along the second path 118. The fractional delay filter 115 is suitable for delaying the second signal 110 emanating from the signal splitter 102 by a selected amount of time relative to the first signal 108. The use of a fractional delay filter 116 along the second path 118 of the system 100 acts to shift the sampling instants of the second signal 110 to different locations along the waveform of the signal 110 relative to the first signal 108. In one embodiment, the fractional delay imparted to a given signal is related to the number of signal paths (N) of system by:

$$FD = \frac{T_S}{N} \qquad \text{(Eq. 1)}$$

where FD is the fractional delay imparted to a signal of a given signal path (e.g., second path 118), $T_s$ is the clock period, and N is the number of signal paths (e.g., two in the example illustrated in FIG. 1A) of the system 100. Fractional delay filtering is generally described by V. Valimaki et al., in *Principles of Fractional Delay Filters*, ICASSP '00, Istanbul, Turkey, 5-9 Jun. 2000, which is incorporated herein by reference in the entirety.

In one embodiment, the two or more bit-stream generators include a first bit-stream generator 112 and a second bit-stream generator 116. Each bit-stream generator 112, 116 acts to convert a multi-bit input signal (e.g., input signal 108 or 110) into a 1-bit data stream (e.g., output signal 122 or 126). In one embodiment, the first bit-stream generator 112 is configured to receive the first multi-bit signal 108 transmitted along a first path 114 from the signal splitter 102 and convert the multi-bit signal 108 to a 1-bit signal 122. In addition, the second bit-stream generator 116 is configured to receive the second multi-bit signal 110 transmitted along a second path 118 from the fractional delay filter 115 and convert the delayed multi-bit signal 110 to a 1-bit signal 126. In one embodiment, each 1-bit data stream emanating from each bit-stream generator 112, 116 contains the desired signal in the band of interest, whereby the shaped truncation error for each data stream is concentrated outside the band of interest. In another embodiment, each bit-stream generator 112, 116 includes, but is not limited to, a high-pass bit-stream generator.

In one embodiment, each bit-stream generator 112, 116 includes, but is not limited to, a delta-sigma modulator. In another embodiment, each bit-stream generator 112, 116 includes, but is not limited to, a pulse-density modulator (PDM). In another embodiment, each bit-stream generator 112, 116 may include, but is not limited to, a pulse-width modulator (PWM). In yet another embodiment, each bit-stream generator 112, 116 includes one or more digital hardware components, including, but not limited to, one or more application specific integrated circuits (ASICs) or one or more field programmable gate arrays (FPGAs).

In one embodiment, the two or more switching power amplifiers of the system 100 include a first switching power amplifier 120 and a second switching power amplifier (SPA) 124. Each switching power amplifier 120, 124 is configured to amplify the signal received from the corresponding bit-stream generator, 112 or 116. In this sense, the first switching power amplifier 120 is configured to amplify signal 122 output from the first bit-stream generator 112, while the second switching power amplifier 124 is configured to amply signal 126 output from the second bit-stream generator 116.

In this regard, each bit-stream generator 112, 116 acts to drive the corresponding switching power amplifier 120, 124, whereby each switching power amplifier 120, 124 acts as high-frequency and high-precision radio frequency (RF) digital-to-analog converter (DAC). In one embodiment, each switching power amplifier 120, 124 converts the 1-bit digital stream from the corresponding bit-stream generator, 112 or 116, into an RF output signal. In an additional embodiment, the switching power amplifier 120 converts the 1-bit digital signal 122 into a first RF output signal 128. In another embodiment, the switching power amplifier 124 converts the 1-bit digital signal 126 into a second RF output signal 130.

In one embodiment, the first switching power amplifier and the second switching power amplifier may include, but are not limited to, class-S switching power amplifiers. In another embodiment, the first switching power amplifier and the second switching power amplifier include, but are not limited to, one or more power transistors. In another embodiment, the first switching power amplifier and the second switching power amplifier include, but are not limited to, one or more GaN transistors, GaAs transistors, or one or more laterally diffused metal oxide semiconductor (LDMOS) transistors.

In one embodiment, the interleaver 132 is configured to execute an interleaving function, whereby the analog outputs of the two or more switching amplifiers of the system 100 are interleaved in the analog domain to form an interleaved output signal. In one embodiment, the interleaver 132 is configured to interleave the analog output signal 128 from the first switching power amplifier 120 with the analog output signal 130 from the second switching power amplifier 124 to form an interleaved output signal 134. In an additional embodiment, the interleaver 132 outputs a signal 134 having a sampling frequency larger than the sampling frequency of the initial signal outputted from the digital source 106. In one embodiment, in the case where the digital source 106 outputs a signal having a sampling frequency of $F_s$, and the system 100 includes two switching power amplifiers 120, 124, the interleaver 132 may output an analog output signal have a sampling frequency of $2 \cdot F_s$. In this regard, the interleaving carried out by the interleaver 132 acts to provide an effective switching speed of two or more digital sequences (e.g., signal 128 and signal 130) larger than the switching speed of the inputted digital sequence of the signal from the digital source 106. The interleaving carried out by the interleaver 132 allows the system 100 to provide switching speeds that extend beyond switching (or clocking) speeds allowable by commonly implemented bit-stream generator technologies, such as CMOS-based ASIC architectures, which are limited to switching frequencies on the order of 1 GHz.

Figure 1B:
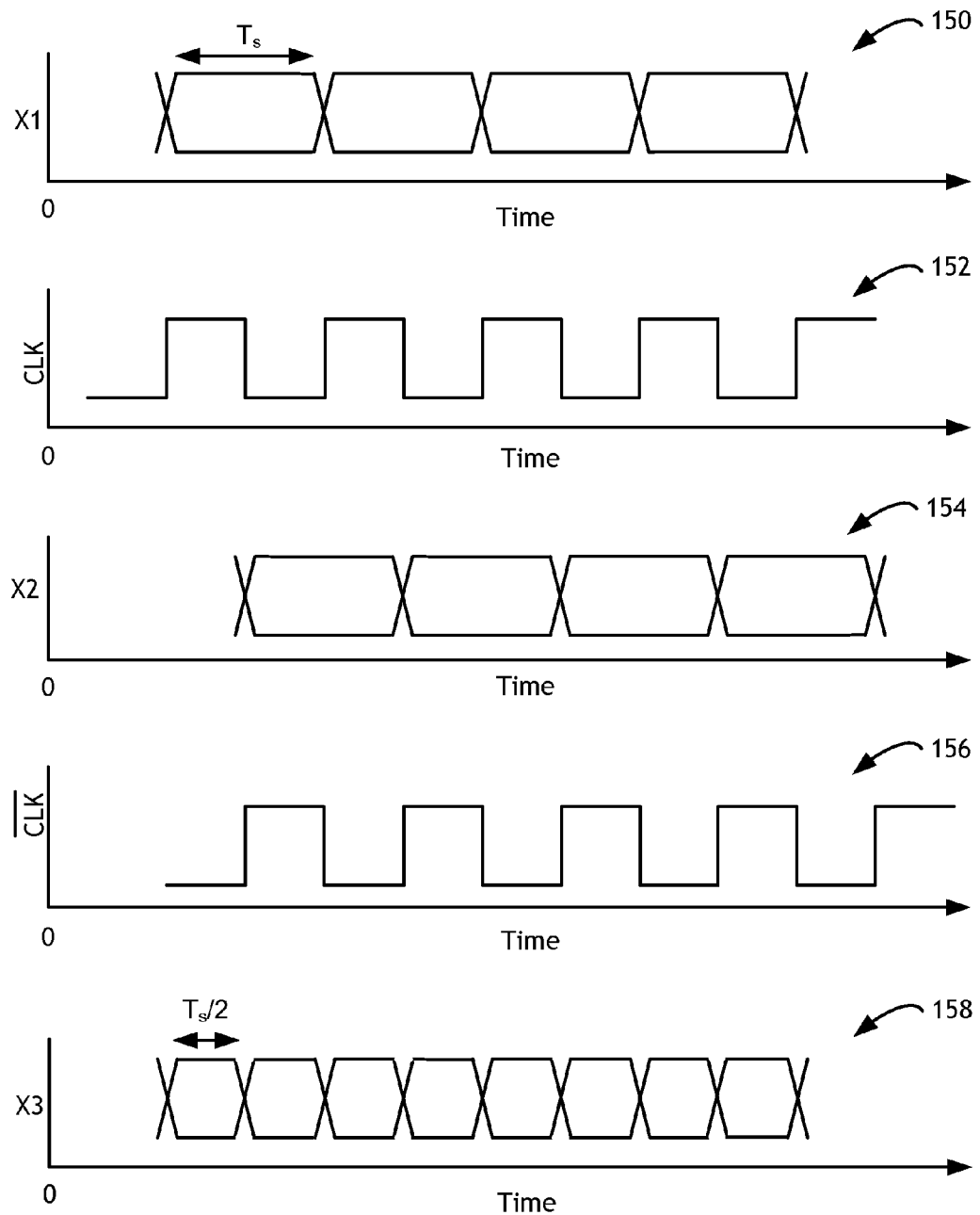
FIG. 1B is a conceptual view of a series of timing diagrams, in accordance with one embodiment of the present invention.

Referring now to FIG. 1B, a series of conceptual timing diagrams at the interleaver 132 of a two-path system 100 are illustrated, in accordance with one embodiment of the present invention. In one embodiment, a first bit-stream signal (x1) as a function of time is represented by curve 150, while the corresponding clock signal (CLK) is represented by the square wave 152. For instance, signal x1 may correspond with the signal 122 emanating from the bit-stream generator 112 of path 114 of system 100. In another embodiment, a second bit-stream signal (x2) shifted in time relative to signal x2 is represented by curve 154, having a corresponding clock signal ($\overline{CLK}$) represented by curve 156. For instance, signal x1 may correspond with signal 126 emanating from bit-stream converter 116, whereby the FD filter 115 has imparted a delay in the signal relative to signal x1. In a further embodiment, signal x1 and x2 may each have a sampling period of T.

In an additional embodiment, a combined interleaved bit-stream signal (x3) as a function of time is represented by curve 158. In this embodiment, the interleaved signal x3 is generated by the interleaving of signal x1 with signal x2. Due to the shifting of x2 relative to x1 in time, the resulting interleaved signal x3 has a sampling frequency larger than (e.g., 2 times greater than) the sampling frequency of the initial signals x1 and x2. In this regard, the interleaving process carried out by the interleaver 132 may act to double the sample frequency of the initial signal(s), which is depicted by the sampling period of $T_s/2$ in FIG. 1B.

Figure 1C:
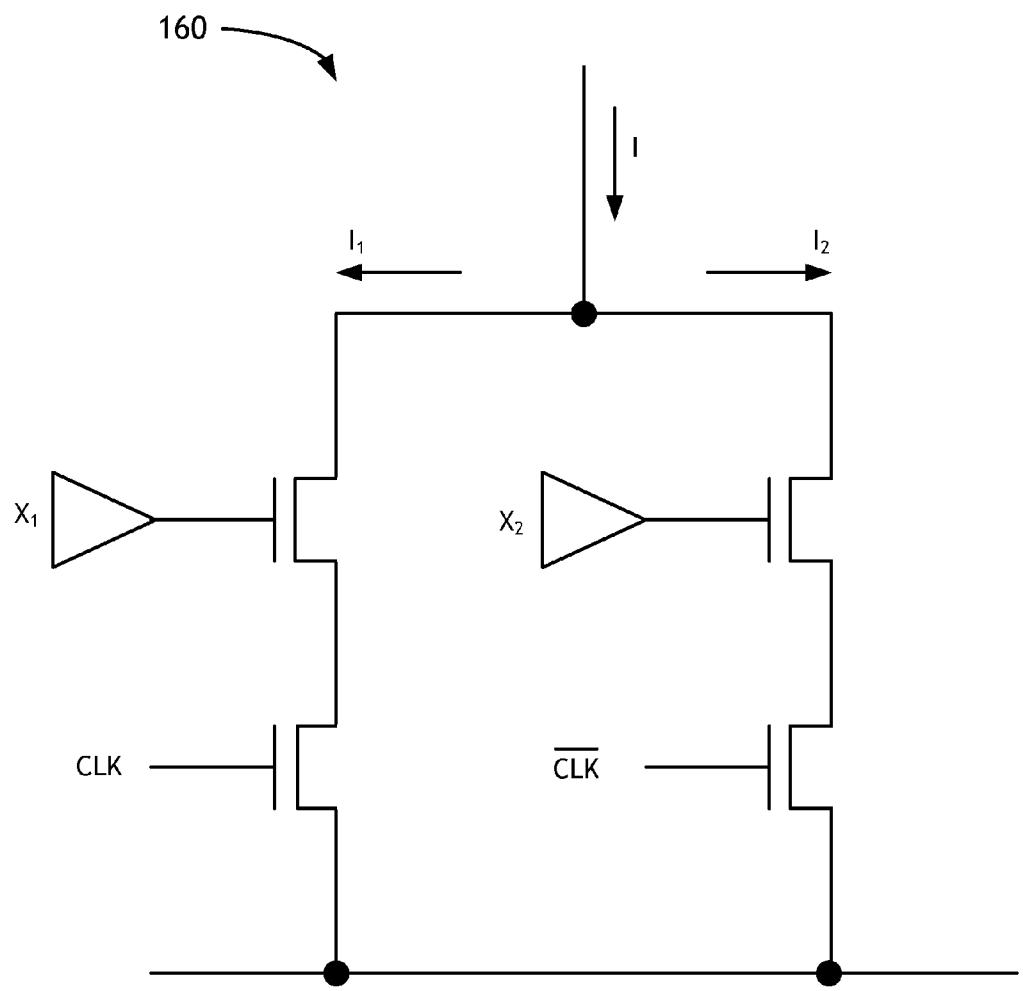
FIG. 1C is a block diagram view of a bridge structure topology of an interleaver, in accordance with one embodiment of the present invention.

Referring now to FIG. 1C, the topology of the interleaver 132 is illustrated, in accordance with one embodiment of the present invention. In one embodiment, the interleaving of a set of split signals (e.g., signal x1 and signal x2) is carried out utilizing a bridge structure topology 160. In this regard, a two-path bridge structure 160 may be configured to interleave a signal x1 from a first signal pathway (e.g., pathway 114) with a signal x2 from a second signal pathway (e.g., pathway 118). In one embodiment, the interleaving topology 160 may include a set of MOS switches configured to control the ON/OFF states of the signals from each signal path of the system 100. In this regard, when CLK is high (and $\overline{CLK}$ is low) signal x1 is output, while signal x2 is output when $\overline{CLK}$ is high (and CLK is low), as shown in the timing diagram of FIG. 1B. The combination of signals x1 and x2 results in the interleaved signal x3 as shown in graph 158 of FIG. 1B.

While the above example focuses on the implementation of MOS switches in carrying out the interleaving process by system 100, it is recognized herein that any suitable switching device may be utilized in the present invention. In one embodiment, the switching devices of the interleaving topology may include, but are not limited to, one or more bipolar switching devices. In another embodiment, the switching devices of the interleaving topology may include, but are not limited to, one or more GaN switching devices.

It is recognized herein that the interleaver and the interleaver topology of the current invention may be extended to N-paths. In particular, the bridge structure topology 160 of the current invention may be extended to an N-path bridge structure. In this regard, the topology 160 of FIG. 1C may be extended to include N clocks that are shifted by $T_s/N$.

Figure 2A:
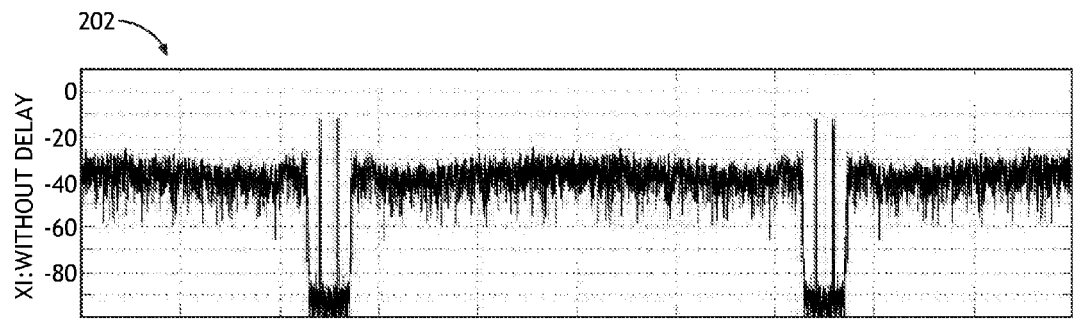
FIGS. 2A-2C illustrates a series of simulated bit-stream spectra depicting an interleaving process of two single-bit signals, in accordance with one embodiment of the present invention.
Figure 2B:
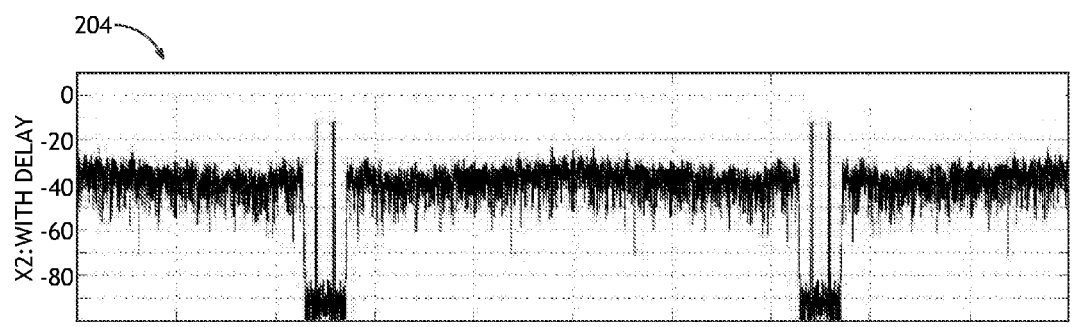
Figure 2C:
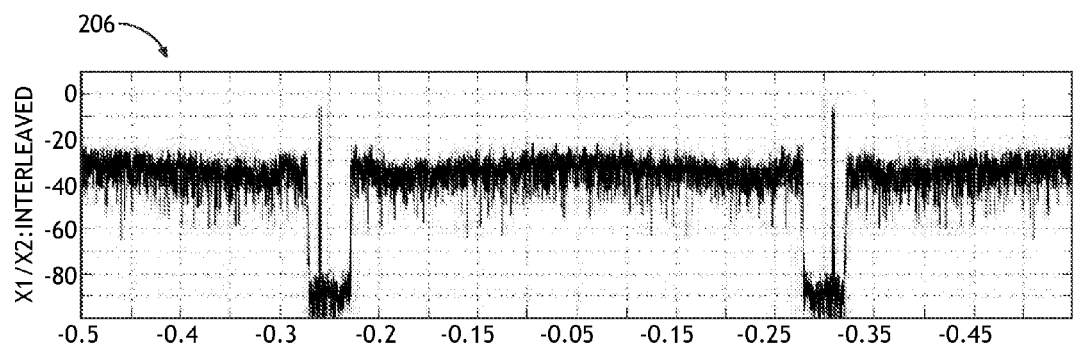

Referring now to FIGS. 2A-2C, a series of simulated high-pass bit-stream spectra are depicted in order to illustrate a two-path bit stream interleaving process in accordance with one embodiment of the present invention. The bit-stream spectra 202 of FIG. 2A corresponds to a first bit-stream signal (x1), wherein bit-stream spectra 204 of FIG. 2B corresponds to a simulated bit-stream signal (x2). FIG. 2C illustrates an interleaved output spectra 206 consistent with an example of an interleaved output signal 134 of the interleaver 132.

In another embodiment, the switching power amplifier system 100 includes one or more RF conditioning circuit elements 136 configured to generate the band-pass RF signal 138 from the interleaved switched waveform signal 134. In one embodiment, the one or more RF conditioning circuit elements 136 include, but are not limited to, a broad-band RF band-pass filter (BPF) 140. In this embodiment, the broad-band RF BPF 140 of the one or more RF conditioning circuit elements 136 is configured to reconstruct the band-pass RF signal 143 from the interleaved switched waveform signal 134.

In an additional embodiment, the one or more RF conditioning circuit elements 136 include, but are not limited to, a narrow-band RF BPF, or duplexer 142. In this embodiment, the duplexer 142 of the one or more RF conditioning circuit elements 136 is configured to receive an output signal 143 from the broad-band RF BPF 140. In this embodiment, the duplexer 142 is further configured to generate an RF transmission signal 138 by attenuating the out-of-band truncation error of the signal 143 transmitted from the broad-band RF BPF 140 to the duplexer 142.

In another embodiment, the switching power amplifier system 100 includes an antenna 144 configured to transmit the conditioned RF transmission signal 138 to one or more receivers (not shown).

Figure 3A:
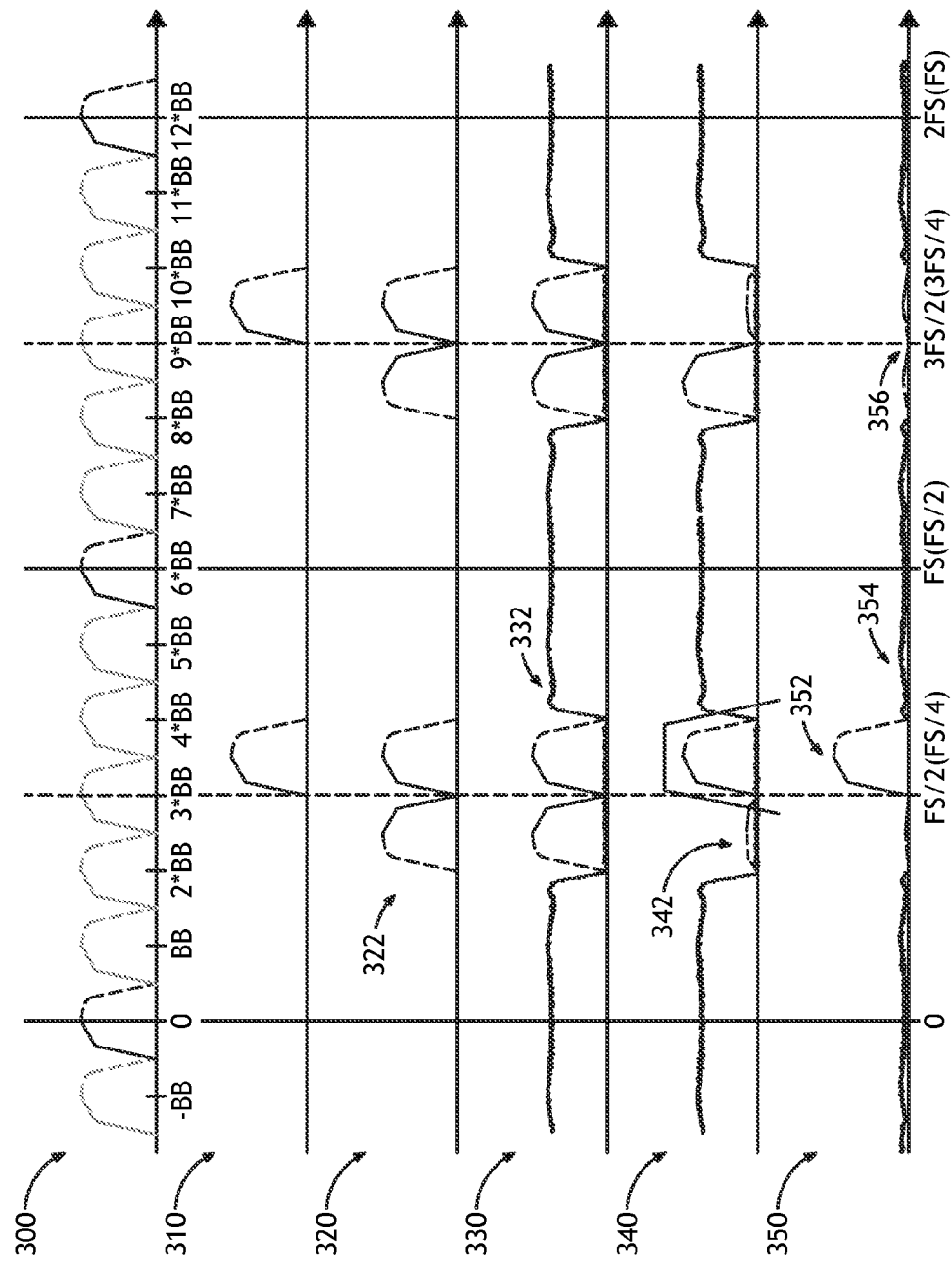
FIG. 3A illustrates a series of simulated bit-stream spectra depicted at various input/output points of the switching power amplifier for multi-path signal interleaving, in accordance with one embodiment of the present invention.
Figure 3B:
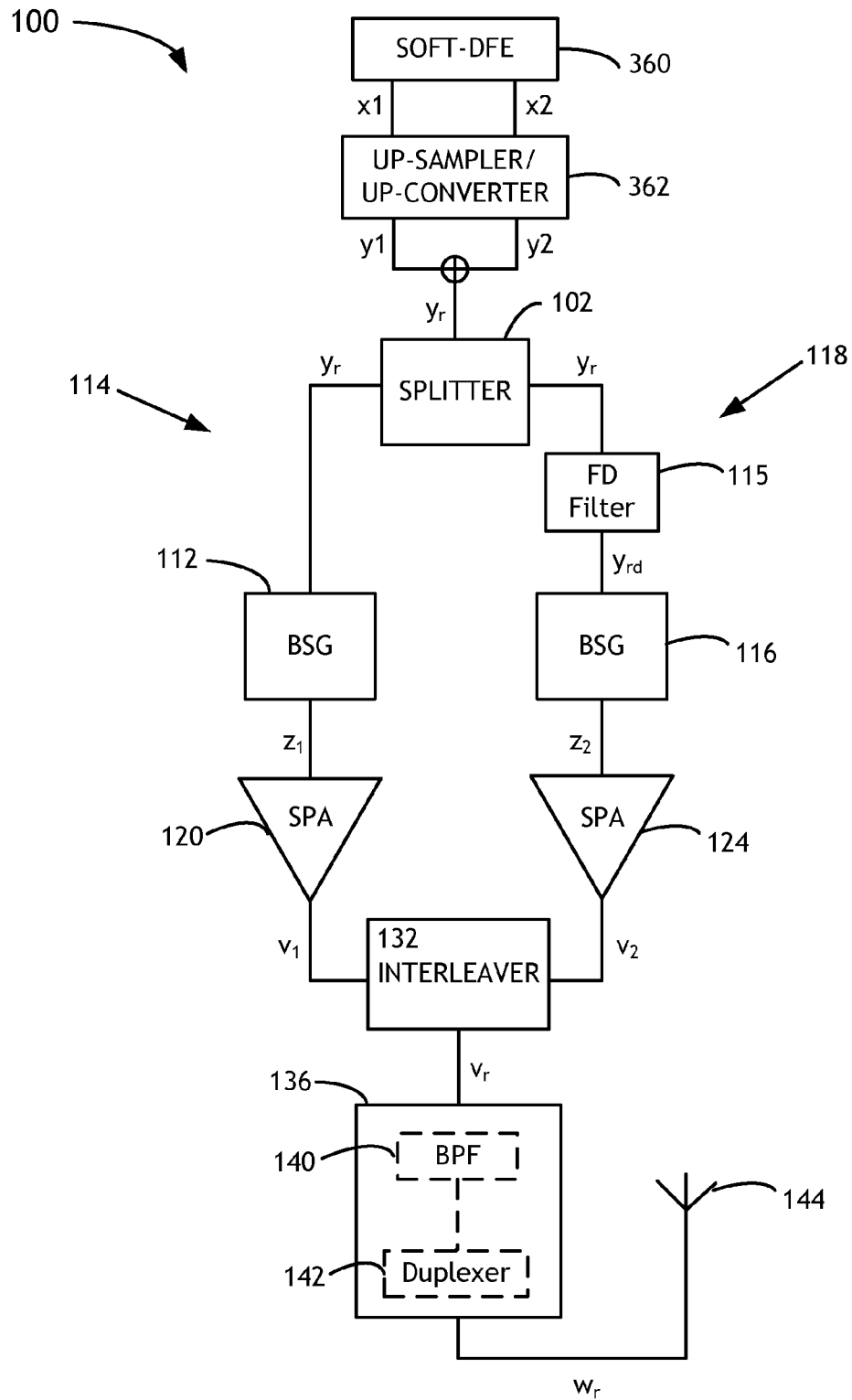
FIG. 3B is a block diagram illustrating the switching power amplifier for two-path signal interleaving in the analog domain, in accordance with one embodiment of the present invention.

Referring now to FIG. 3A, a series of simulated two-path bit-stream spectra are illustrated at various steps within the signal interleaving process of the present invention. In one embodiment, a corresponding system 100 suitable for carrying out the steps depicted in FIG. 3A is illustrated in FIG. 3B. In one embodiment, the digital source 106 of the system 100 may include a soft decision equalizer (DFE) 360 suitable for outputting a set of baseband signals, first signal x1 and second signal x2, at a sampling frequency of BB. Graph 300 of FIG. 3B depicts the complex signal ($x_c$) consisting of the sum of x1 and x2, wherein x1 is represented by the dotted curve and x2 is represented by the solid curve. In another embodiment, the digital source 106 may include an up-sampler/up-converter 362 configured to receive signals x1 and x2 from the soft-DFE and up-convert/up-sample the signals such that the up-sample/up-converter 362 outputs signals y1 and y2. Graph 310 depicts the complex signal ($y_c$) consisting of the sum of y1 and y2 outputted from the up-sample/up-converter 362, wherein y1 is represented by the dotted curve and y2 is represented by the solid curve. Applicants note that the sampling frequency associated with signals y1 and y2 is $F_s$, as shown in graph 310. The real signal ($y_r$) of the combined y1 and y2 signals is depicted in graph 320. Applicants note the existence of aliasing is evidenced by the left-sided mirror signals 322. Applicants further note that aliasing in the $y_r$ signal results from the real sampling at the sampling frequency, E.

In another embodiment, as discussed previously herein, the real signal $y_r$ (e.g., signal 104 as discussed previously herein), is split into multiple pathways (e.g., path 114 and path 118 in a two-path case) by splitter 102. In one embodiment, the FD filter 115 delays the signal in the second path 118 of the system 100 relative to the signal transmitted via the first path 114. In an additional embodiment, the delayed signal, $y_{rd}$, transmitted through the FD filter 115 of the second path 118 is delayed relative to the signal $y_r$ in the first path 114. For instance, in the case illustrated in FIG. 3B, the FD filter 115 may impart a delay of $\pi$ (F/Fs) to the delayed signal, $y_{rd}$. It is further noted that both the signal $y_r$ in the first path 114 and the delay signal $y_{rd}$ in the second path 118 are both sampled at a sampling frequency of FS.

In another embodiment, the signals $y_r$ and $y_{rd}$ are inputted into a set of bit-stream converters 112 and 116, as discussed previously herein. The bit-stream converters 112, 116, in turn, each output a single-bit stream z1 and z2 respectively. Graph 330 of FIG. 3B depicts signals z1 and z2, wherein z1 is represented by the dotted curve and z2 is represented by the solid curve. Applicants note that curve 332 represents the shaped one-bit truncation error caused by the bit-stream generators 112, 116.

In an additional embodiment, the signals z1 and z2 are inputted into a set of switching power amplifiers 120 and 124, as discussed previously herein. The amplifiers 120, 124, in turn, each output an RF signal v1 and v2 respectively. In an additional embodiment, the RF signals v1 and v2 are inputted into the interleaver 132, as discussed previously herein. In an additional embodiment, the interleaver 132 interleaves signal v1 with v2 in order to output a combined interleaved signal $v_r$. Graph 340 of FIG. 3B depicts the interleaved output signal $v_r$ formed by interleaving the v1 and v2 RF signals inputted into the interleaver 132. In graph 340, the RF signal v1 is represented by the dotted curve and the RF signal v2 is represented by the solid curve. Applicants note that the aliasing observed in graphs 320 and 330 is at least partially canceled as a result of the interleaving of signals v1 and v2. Applicants further note that in some instances, as shown by feature 342 in graph 340, the alias cancellation may be imperfect due to I/Q mismatch. It is further noted that the real $v_r$ signal is sampled at $2 \cdot F_s$, which is twice the initial sampling frequency (FS) of a single signal (e.g., signal y1 or y2).

In another embodiment, the real interleaved RF signal $v_r$ is inputted into one or more RF conditioning circuit elements 136, as discussed previously herein. In an additional embodiment, the RF conditioning circuit element 136 may include, but is not limited to, a duplexer 142. In this embodiment, a duplexer 142 of the system is configured to receive the signal $v_r$ from the interleaver 132 (or other filtering components, such as a broad-band RF BPF 140). The duplexer 142 is further configured to output an RF signal $w_r$ by attenuating out-of-band truncation error from the input signal $v_r$. Applicants note that some residual noise and aliasing may exist following band-pass filtering by the duplexer 142, as depicted by the non-zero values in curve 354 and signal 356. In an additional embodiment, the filter signal $w_r$ is transmitted to a receiver (not shown) via an antenna 144, as depicted by the desired output feature 352 in graph 350.

It is noted herein that the interleaving process carried out by system 100 as described above may be implemented, in part, utilizing a zero-order hold (ZOH) in the digital-to-analog conversion by power amplifiers 120, 124. Applicants note that the relative attenuation in the system 100 may be a function of pulse width. As such, in considering the impact of signal degradation via the interleaving system 100, it is useful to consider the width of the pulse at the D/A output. In an additional aspect, it is recognized that the RC response of the gate driver(s) of the system 100 may impact the ZOH of the system 100. In this regard, the rise/fall time of the gate driver may generate an additional loss associated with the RC response of the system 100.

In an additional aspect, it is again noted that up-sampling by the system 100 components (e.g., up-sampler 362) creates aliasing in the output signals (prior to interleaving). Applicants note that the elimination of the alias image (see 322 of graph 320) by the interleaving process carried out by system 100 may be understood in a number of ways. In one aspect, a linear interpolation may attenuate the image. In this manner, a second signal (x2) may be a linear interpolation of a first signal (x1) at a time $T_s/2$. It is further recognized that linear attenuation may be more effective at low frequencies. As discussed previously herein and shown in FIG. 3A, the image cancellation may be imperfect for non-zero frequencies. In another aspect, a second signal (x2) may be a cubic interpolation of a first signal (x1). In yet another aspect, a second signal (x2) may be an "ideal" interpolation of a first signal (x1). In this regard, an "ideal" interpolation may include, but is not limited to, a closed form solution yielding a frequency independent image rejection. Applicants further note that simulations further confirm the frequency independent image rejection by the system 100.

Figure 4:
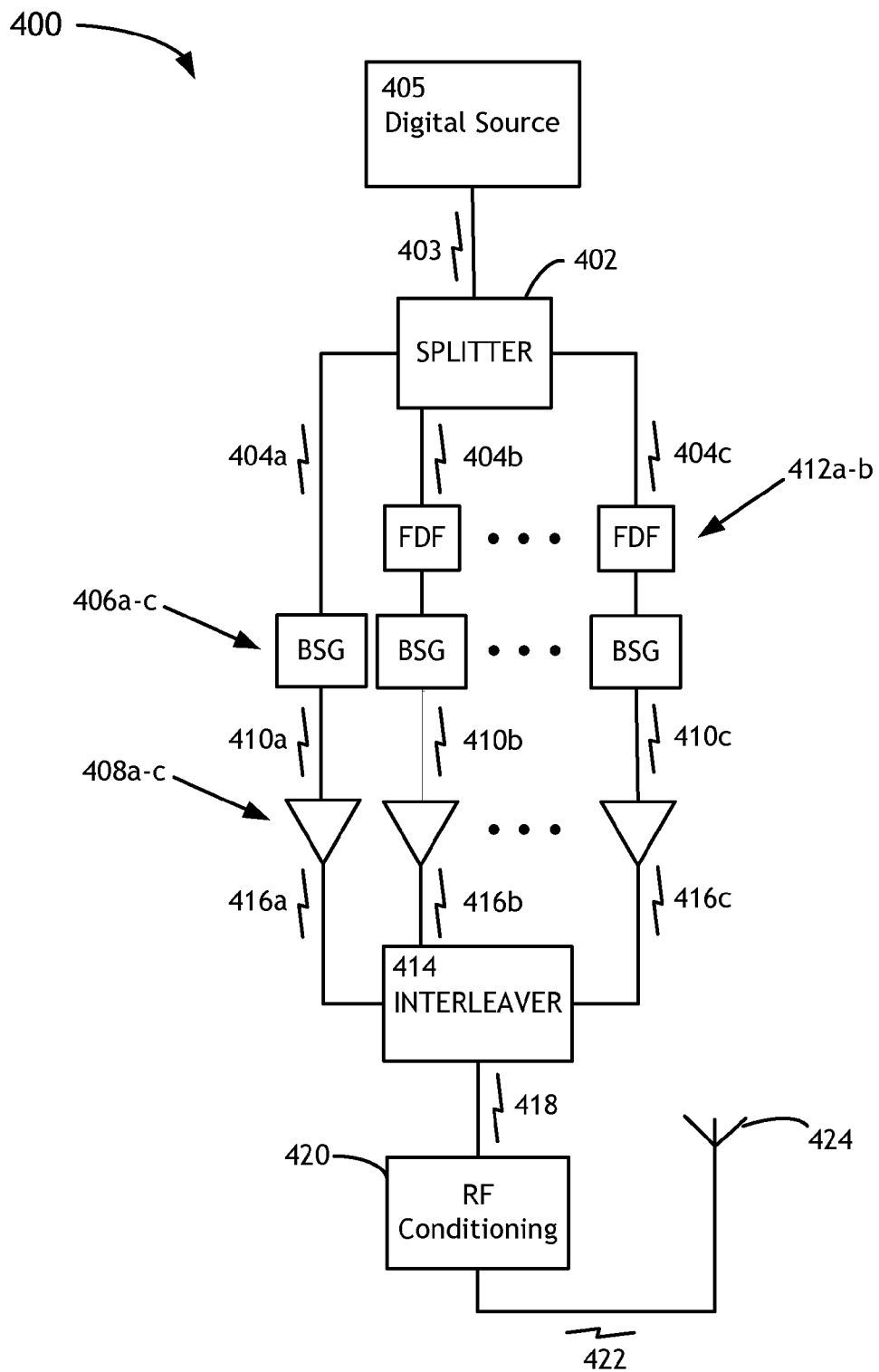
FIG. 4 is a block diagram illustrating the switching power amplifier for N-path signal interleaving in the analog domain, in accordance with another embodiment of the present invention.

While the present disclosure has focused on a switching power amplifier system 100 including a two-path bit-stream interleaving process, it is noted herein that the switching power amplifier system 100 may readily be extended to any number of bit-stream paths (i.e., N-path bit-stream interleaving process). As shown in FIG. 4, an N-path switching power amplifier system 400 includes N bit-stream generators (e.g., bit-stream generators 406a-406c), each configured to receive a multi-bit signal (e.g., multi-bit signals 404a-404c) from a sample splitter 402. In addition, the N-path switching power amplifier system may include N switching power amplifiers (e.g., switching power amplifiers 408a-c), whereby each switching power amplifier is configured to receive as an input a 1-bit stream (e.g., single-bit signals 410a-410c) from one of the N bit-stream generators. In another embodiment, the N-path switching power amplifier system may include N−1 fractional delay filters (e.g., 412a-b) along N−1 paths emanating from N−1 of the N bit-stream generators. In an additional embodiment, an interleaver of the N-path switching power amplifier system is configured to interleave the N signals (e.g., signals 416a-c) outputted from the N switching power amplifiers, whereby the signal 418 outputted from the interleaver 414 has a sampling frequency larger than the source signal 403 from the digital source 405. This N-component interleaved signal 418 is then processed by one or more RF signal conditioning elements 420 in a manner similar to the case described previously herein, whereby the RF conditioning elements 420 transmit a conditioned signal 422 to antenna 424.

Figure 5:
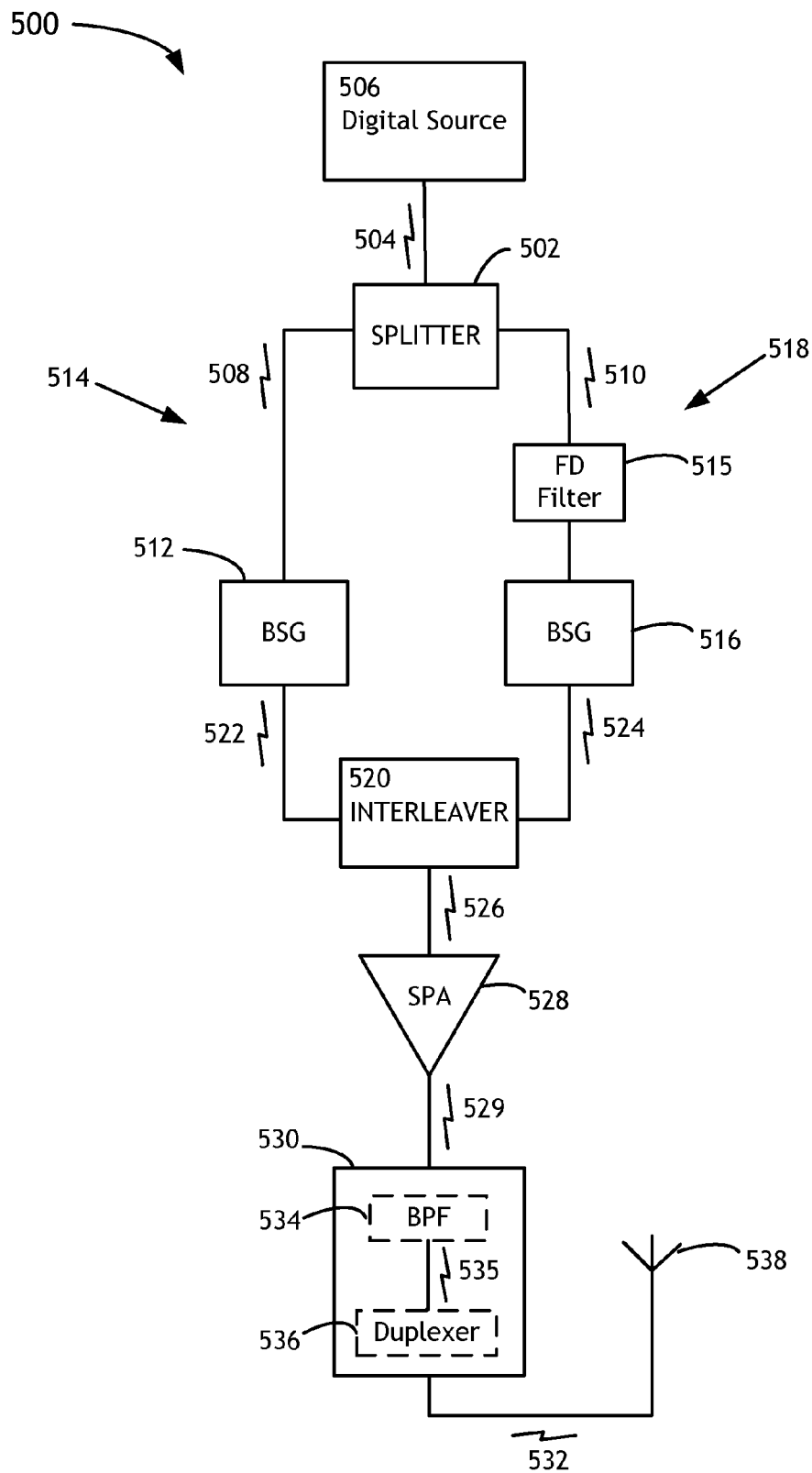
FIG. 5 is a block diagram illustrating the switching power amplifier for two-path signal interleaving in the digital domain, in accordance with one embodiment of the present invention.

Referring now to FIG. 5, a block diagram of a switching power amplifier system 500 for multi-path signal interleaving is described in accordance with an additional embodiment of the present invention. It is noted by the applicants that the description of system 100 provided previously herein should be interpreted to extend to system 500 unless noted otherwise.

In one embodiment, the switching power amplifier system 500 includes a signal splitter 502 and two or more bit-stream generators (e.g., a first bit-stream generator 512, a second bit-stream generator 516, and up to and including an Nth bit-stream generator) suitable for receiving the multi-path signals from the signal splitter 502. The switching power amplifier system 500 includes an interleaver 520 for interleaving the digital outputs of the two or more bit-stream generators. The switching power amplifier system 500 further includes a single switching power amplifier 524 coupled to the output of the interleaver 520.

In one embodiment, the signal splitter 502 of the switching power amplifier system 500 is configured to split a source signal 504 from a digital signal source 506 into a first signal 508 transmitted along a first path 514 and a second signal 510 transmitted along a second path 518. The signal splitter 502 may include any signal splitter known in the art.

In another embodiment, the system 500 includes a fractional delay filter 515 disposed along the second path 518. The fractional delay filter 515 is suitable for delaying the second signal 510 emanating from the signal splitter 502 by a selected amount of time relative to the first signal 508.

In one embodiment, the two or more bit-stream generators include a first bit-stream generator 512 and a second bit-stream generator 516. Each bit-stream generator 512, 516 acts to convert a multi-bit input signal (e.g., input signal 508 or 510) into a 1-bit data stream (e.g., output signal 522 or 524). In one embodiment, the first bit-stream generator 512 is configured to receive the first multi-bit signal 508 transmitted along a first path 514 from the signal splitter 502 and convert the multi-bit signal 508 to a 1-bit signal 522. In addition, the second bit-stream generator 516 is configured to receive the second multi-bit signal 510 transmitted along a second path 518 through the fractional delay filter 515 and convert the delayed multi-bit signal 510 to a 1-bit signal 524. In one embodiment, each 1-bit data stream emanating from each bit-stream generator 512, 516 contains the desired signal in the band of interest, whereby the shaped truncation error for each data stream is concentrated outside the band of interest. In another embodiment, each bit-stream generator 512, 516 includes, but is not limited to, a high-pass bit-stream generator.

In one embodiment, each bit-stream generator 512, 516 includes, but is not limited to, a delta-sigma modulator. In another embodiment, each bit-stream generator 512, 516 includes, but is not limited to, a pulse-width modulator (PWM). In another embodiment, each bit-stream generator 512, 516 includes, but is not limited to, a pulse-density modulator (PDM). In yet another embodiment, each bit-stream generator 512, 516 includes one or more digital hardware components, including, but not limited to, one or more application specific integrated circuits (ASICs) or one or more field programmable gate arrays (FPGAs).

In one embodiment, the interleaver 520 is configured to execute an interleaving function, whereby the digital outputs of the two or more bit-stream generators 512, 516 of the system 500 are interleaved in the digital domain to form an interleaved digital output signal. In one embodiment, the interleaver 520 is configured to interleave the digital output signal 522 from the first bit-stream generator 512 with the digital output signal 524 from the second bit-stream generator 516 to form an interleaved digital output signal 526. In an additional embodiment, the interleaver 520 outputs a digital signal 526 having a sampling frequency larger than the sampling frequency of the initial signal outputted from the digital source 506. In one embodiment, in the case where the digital source 506 outputs a signal having a sampling frequency of $F_s$, and the system 500 includes two bit-stream generators 512, 516, the interleaver 520 may output a digital signal have a sampling frequency of $2 \cdot F_s$. In this regard, the interleaving carried out by the interleaver 520 acts to provide an effective switching speed of two or more digital sequences (e.g., signal 522 and signal 524) larger than the switching speed of the inputted digital sequence of the signal from the digital source 506.

In one embodiment, the switching power amplifier 528 is configured to amplify the signal received from the interleaver 520. In this regard, the interleaved digital output 526 from the interleaver 520 acts to drive the switching power amplifier 528, whereby the switching power amplifier 528 acts as a high-frequency and high-precision radio frequency (RF) digital-to-analog converter (DAC). In one embodiment, the switching power amplifier 528 converts the 1-bit digital stream from the interleaver 520 into an RF output signal 529.

In one embodiment, the switching power amplifier 528 may include, but is not limited to, a class-S switching power amplifier. In another embodiment, the switching power amplifier 528 includes, but is not limited to, one or more power transistors. In another embodiment, the switching power amplifier 528 includes, but is not limited to, one or more GaN transistors, GaAs transistors, or one or more laterally diffused metal oxide semiconductor (LDMOS) transistors.

In another embodiment, the switching power amplifier system 500 includes one or more RF conditioning circuit elements 530 configured to generate the band-pass RF signal 532 from the interleaved switched waveform signal 529. In one embodiment, the one or more RF conditioning circuit elements 530 include, but are not limited to, a broad-band RF band-pass filter (BPF) 534. In this embodiment, the broad-band RF BPF 534 of the one or more RF conditioning circuit elements 530 is configured to reconstruct the band-pass RF signal 535 from the interleaved switched waveform signal 529.

In an additional embodiment, the one or more RF conditioning circuit elements 530 include, but are not limited to, a narrow-band RF BPF, or duplexer 536. In this embodiment, the duplexer 536 of the one or more RF conditioning circuit elements 530 is configured to receive an output signal 535 from the broad-band RF BPF 534. In this embodiment, the duplexer 536 is further configured to generate an RF transmission signal 532 by attenuating the out-of-band truncation error of the signal 535 transmitted from the broad-band RF BPF 534 to the duplexer 536.

In another embodiment, the switching power amplifier system 500 includes an antenna 538 configured to transmit the conditioned RF transmission signal 532 to one or more receivers (not shown).

Figure 6:
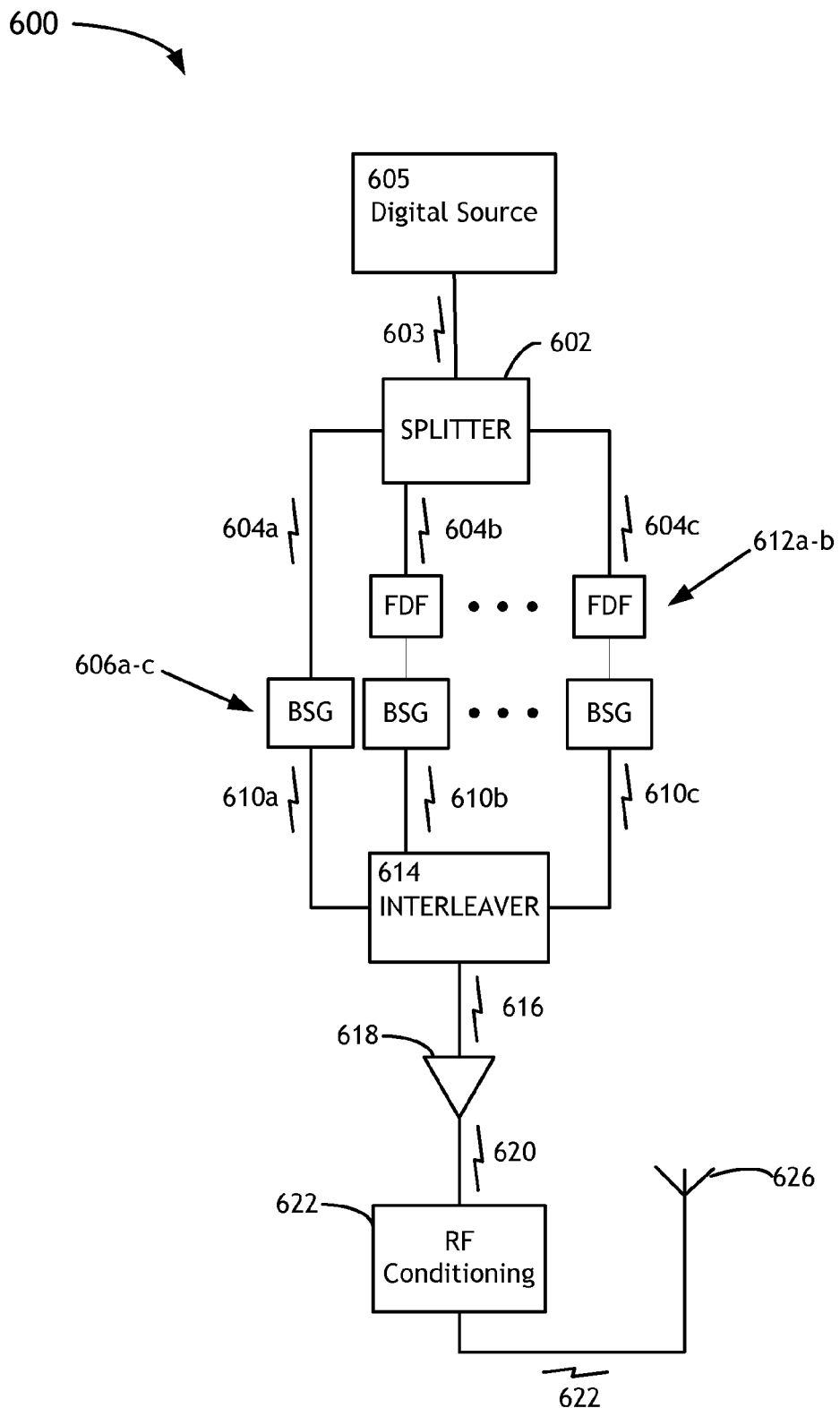
FIG. 6 is a block diagram illustrating the switching power amplifier for N-path signal interleaving in the digital domain, in accordance with one embodiment of the present invention.

While the present disclosure has focused on a switching power amplifier system 500 including a two-path bit-stream interleaving process, it is noted herein that the switching power amplifier system 500 may readily be extended to any number of bit-stream paths (i.e., N-path bit-stream interleaving process). As shown in FIG. 6, an N-path switching power amplifier system 600 includes N bit-stream generators (e.g., bit-stream generators 606a-606c), each configured to receive a multi-bit signal (e.g., multi-bit signals 604a-604c) from a sample splitter 602. In addition, the N-path switching power amplifier system 600 includes an interleaver 614 configured to interleave the N signals (e.g., signals 610a-c) outputted from the N bit-stream generators to form an interleaved digital signal 616 with an increased sampling frequency relative to the source signal 603 outputted from the digital source 605. In addition, the N-path switching power amplifier system 600 may include a single switching power amplifier 618 configured to receive as an input the 1-bit stream 616 from the interleaver. In another embodiment, the N-path switching power amplifier system may include N−1 fractional delay filters (e.g., fractional delay filters 612a-b) distributed along N−1 paths associated with N−1 of the N bit-stream generators. In an additional embodiment, the signal 620 outputted from the switching power amplifier 618 is then processed by one or more RF signal condition elements 622 in a manner similar to the cases described previously herein, whereby the RF conditioning elements 622 transmit a conditioned signal 624 to antenna 626.

Figure 7:
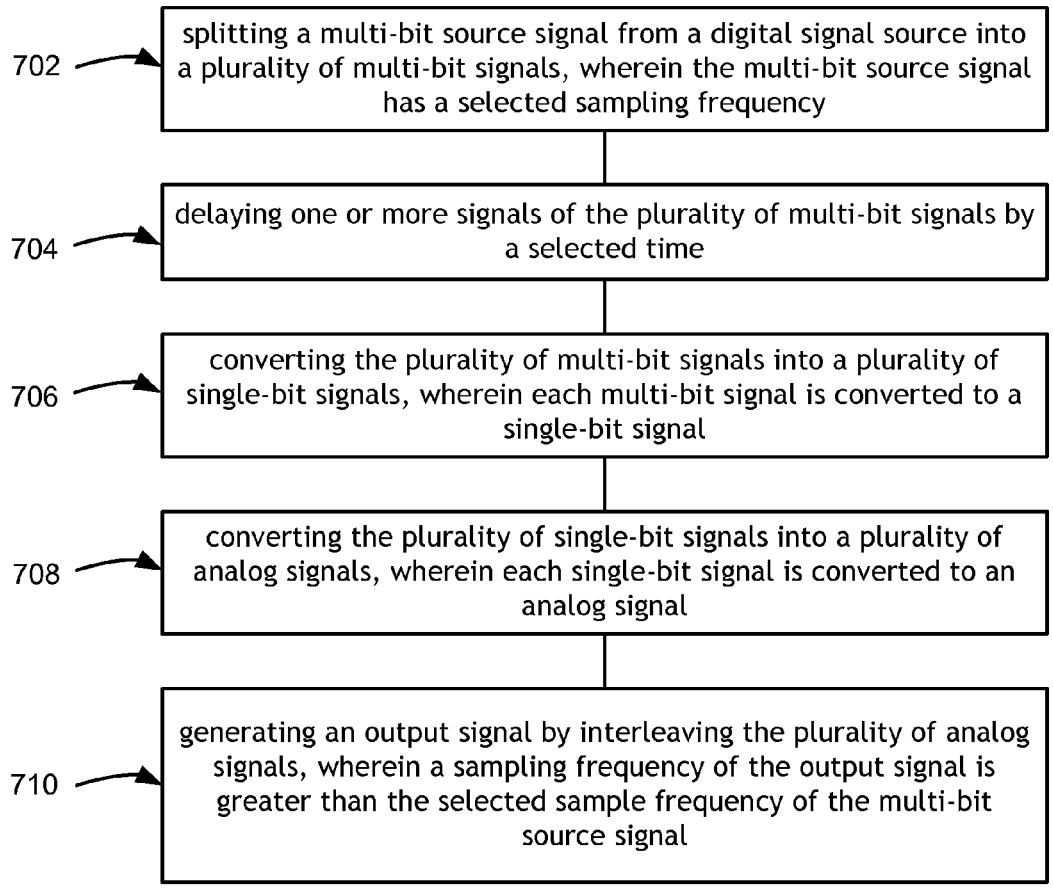
FIG. 7 is a process flow diagram depicting a method for multi-path signal interleaving, in accordance with one embodiment of the present invention.

FIG. 7 illustrates a process flow diagram depicting a method 700 for multi-path signal interleaving, in accordance with one embodiment of the present invention. Applicants note that, while method 700 may be carried out using one or more of the system-level embodiments described previously herein, the method 700 is not limited to the architectural aspects described previously herein.

In step 702, a multi-bit source signal from a digital signal source is split into a plurality of multi-bit signals. In an additional embodiment, the multi-bit source signal has a selected sampling frequency (FS). In step 704, one or more of the multi-bit signals is delayed by a selected time. In step 706, the multi-bit signals are converted into a plurality of single-bit signals, wherein each multi-bit signal is converted to a single-bit signal. In step 708, the plurality of single-bit signals are converted into a plurality of analog signals, wherein each single-bit signal is converted to an analog signal. In step 710, an output signal is generated by interleaving the plurality of analog signals. In an additional embodiment, a sampling frequency of the single-bit interleaved output signal is greater (e.g., sampling frequency of the single-bit interleaved output is $N \cdot F_s$) than the selected sample frequency of the multi-bit source signal.

Figure 8:
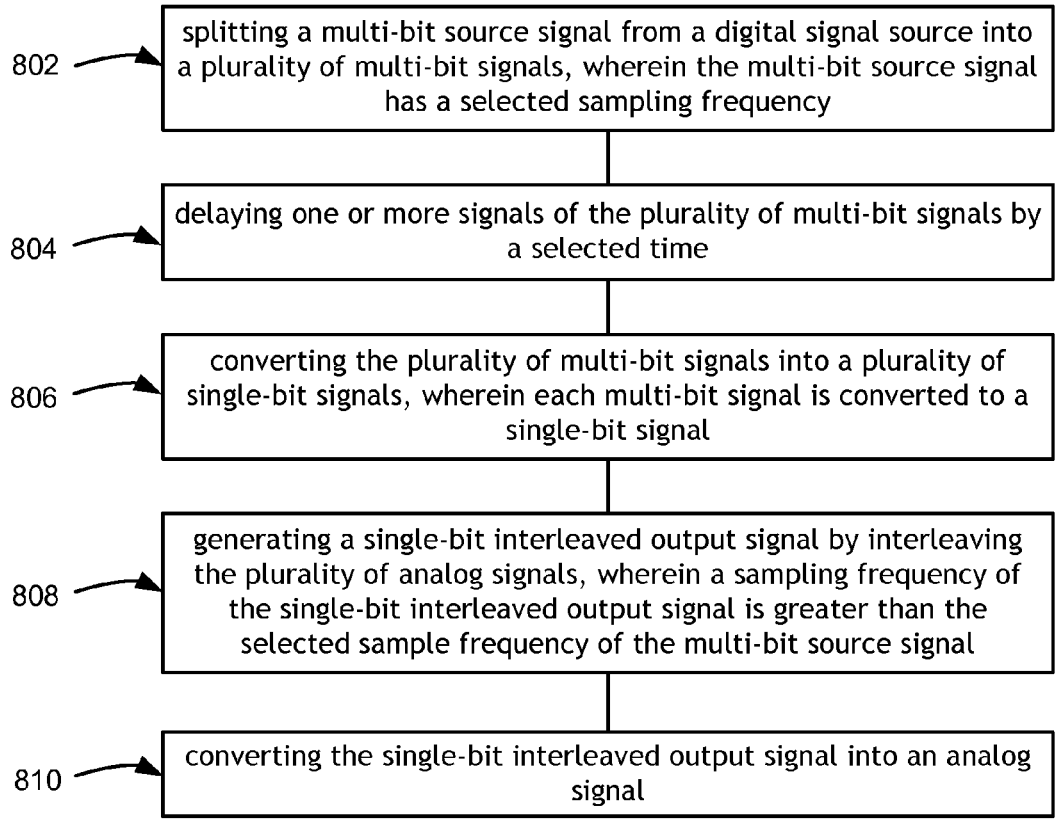
FIG. 8 is a process flow diagram depicting a method for multi-path signal interleaving, in accordance with one embodiment of the present invention.

FIG. 8 illustrates a process flow diagram depicting a method 800 for multi-path signal interleaving, in accordance with one embodiment of the present invention. Applicants note that, while method 800 may be carried out using one or more of the system-level embodiments described previously herein, the method 800 is not limited to the architectural aspects described previously herein.

In step 802, a multi-bit source signal from a digital signal source is split into a plurality of multi-bit signals. In an additional embodiment, the multi-bit source signal has a selected sampling frequency (FS). In step 704, one or more of the multi-bit signals is delayed by a selected time. In step 706, the multi-bit signals are converted into a plurality of single-bit signals, wherein each multi-bit signal is converted to a single-bit signal. In step 708, a single-bit interleaved output signal is generated by interleaving the plurality of analog signals. In an additional embodiment, a sampling frequency of the single-bit interleaved output signal is greater (e.g., sampling frequency of the single-bit interleaved output is $N \cdot F_s$) than the selected sample frequency of the multi-bit source signal. In step 710, the single-bit interleaved output signal is converted into an analog signal.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A switching power amplifier system for multi-path signal interleaving, comprising:
a signal splitter configured to receive a multi-bit source signal from a digital signal source, wherein the signal splitter is configured to split the multi-bit source signal from the digital source into a plurality of multi-bit signals, wherein the multi-bit source signal has a selected sampling frequency;
one or more fractional delay filters configured to delay one or more signals of the plurality of signals by a selected time;
a plurality of bit-stream converters, each bit-stream converter configured to receive one of the plurality of multi-bit signals, each bit-stream converter further configured to generate a single-bit signal based on a received multi-bit signal;
a plurality of switching power amplifiers, each switching power amplifier configured to receive a single-bit signal from one of the bit-stream converters, wherein each of the switching power amplifiers is configured to convert the received single-bit signal from one of the bit-stream converters to an analog signal; and
an interleaver configured to generate an interleaved output by interleaving two or more outputs of the plurality of switching power amplifiers, wherein a sampling frequency of the interleaved output of the interleaver is greater than the selected sampling frequency of the multi-bit source signal.

2. The switching power amplifier system of claim 1, wherein one or more of the bit-stream generators comprise:
a high-pass bit stream generators.

3. The switching power amplifier system of claim 1, wherein one or more of the bit-stream generators comprise:
at least one of a delta-sigma modulator, a pulse-width modulator, and a pulse-density modulator.

4. The switching power amplifier system of claim 1, wherein one or more of the bit-stream generators include at least one of an application specific integrated circuit (ASIC) and a field programmable gate array (FPGA).

5. The switching power amplifier system of claim 1, wherein one or more of the switching power amplifiers comprise:
a class-S switching power amplifier.

6. The switching power amplifier system of claim 1, wherein the fractional delay filter is configured to delay a first signal of the plurality of signals by a selected time relative to at least a second signal of the plurality of signals.

7. The switching power amplifier system of claim 1, wherein the interleaver includes a bridge structure topology.

8. The switching power amplifier system of claim 1, further comprising:
one or more radio frequency (RF) conditioning circuit elements configured to generate a band-pass RF signal from the interleaved output from the interleaver.

9. The switching power amplifier system of claim 8, wherein the one or more radio frequency (RF) conditioning circuit elements comprise:
one or more broad-band RF band-pass filters.

10. The switching power amplifier system of claim 8, wherein the one or more radio frequency (RF) conditioning circuit elements comprise:
one or more narrow-band RF band-pass filters.

11. The switching power amplifier system of claim 8, further comprising:
an antenna communicatively coupled to an output of the one or more RF conditioning circuit elements.

12. A switching power amplifier system for multi-path signal interleaving, comprising:
a signal splitter configured to receive a multi-bit source signal from a digital signal source, wherein the signal splitter is configured to split the multi-bit source signal from the digital source into a plurality of multi-bit signals, wherein the multi-bit source signal has a selected sampling frequency;
one or more fractional delay filters configured to delay one or more signals of the plurality of signals by a selected time;
a plurality of bit-stream converters, each bit-stream converter configured to receive one of the plurality of multi-bit signals, each bit-stream converter further configured to generate a single-bit signal based on a received multi-bit signal;
an interleaver configured to generate a single-bit interleaved output by interleaving two or more outputs of the plurality of bit-stream converters, wherein a sampling frequency of the interleaved output of the interleaver is greater than the selected sampling frequency of the multi-bit source signal; and
a switching power amplifier configured to receive the single-bit interleaved output signal from the interleaver, wherein the switching power amplifier is configured to convert the single-bit interleaved output signal from the interleaver to an analog signal.

13. The switching power amplifier system of claim 12, wherein one or more of the bit-stream generators comprise:
a high-pass bit stream generators.

14. The switching power amplifier system of claim 12, wherein one or more of the bit-stream generators comprise:
at least one of a delta-sigma modulator, a pulse-width modulator, and a pulse-density modulator.

15. The switching power amplifier system of claim 12, wherein the switching power amplifier comprises:
a class-S switching power amplifier.

16. The switching power amplifier system of claim 12, wherein the fractional delay filter is configured to delay a first signal of the plurality of signals by a selected time relative to at least a second signal of the plurality of signals.

17. The switching power amplifier system of claim 12, wherein the interleaver includes a bridge structure topology.

18. The switching power amplifier system of claim 12, further comprising:
one or more radio frequency (RF) conditioning circuit elements configured to generate a band-pass RF signal from the analog signal from the switching power amplifier.

19. The switching power amplifier system of claim 18, wherein the one or more radio frequency (RF) conditioning circuit elements comprise:
at least of one or more broad-band RF band-pass filters and one or more narrow-band RF band-pass filters.

20. A method for multi-path signal interleaving, comprising:
splitting a multi-bit source signal from a digital signal source into a plurality of multi-bit signals, wherein the multi-bit source signal has a selected sampling frequency;
delaying one or more signals of the plurality of multi-bit signals by a selected time;
converting the plurality of multi-bit signals into a plurality of single-bit signals, wherein each multi-bit signal is converted to a single-bit signal;
converting the plurality of single-bit signals into a plurality of analog signals, wherein each single-bit signal is converted to an analog signal; and
generating an output signal by interleaving the plurality of analog signals, wherein a sampling frequency of the output signal is greater than the selected sample frequency of the multi-bit source signal.

* * * * *